(12) United States Patent
Balch et al.

(10) Patent No.: US 6,284,564 B1
(45) Date of Patent: Sep. 4, 2001

(54) HDI CHIP ATTACHMENT METHOD FOR REDUCED PROCESSING

(75) Inventors: Ernest Wayne Balch, Ballston Spa; Leonard Richard Douglas, Burnt Hills; Thomas Bert Gorczyca, Schenectady, all of NY (US)

(73) Assignee: Lockheed Martin Corp., Moorestown, NJ (US)

( * ) Notice: Subject to any disclaimer, the term of this patent is extended or adjusted under 35 U.S.C. 154(b) by 0 days.

(21) Appl. No.: 09/399,461

(22) Filed: Sep. 20, 1999

(51) Int. Cl.[7] .......................... H01L 21/44; H01L 21/48; H01L 21/50
(52) U.S. Cl. ......................... 438/106; 438/108; 438/119
(58) Field of Search .................................. 438/106, 108, 438/119

(56) References Cited

U.S. PATENT DOCUMENTS

| | | |
|---|---|---|
| 5,125,153 * | 6/1992 | Frey et al. . |
| 5,302,547 * | 4/1994 | Wojnarowski et al. . |
| 5,306,670 * | 4/1994 | Mowatt et al. . |
| 5,468,681 * | 11/1995 | Pasch . |
| 5,590,462 * | 1/1997 | Hundt et al. . |
| 5,932,118 * | 8/1999 | Yamamoto et al. . |
| 6,221,693 * | 4/2001 | Ho . |

* cited by examiner

Primary Examiner—Jey Tsai
Assistant Examiner—Josetta I. Jones
(74) Attorney, Agent, or Firm—W. H. Meise; S. D. Weinstein

(57) ABSTRACT

A method according to an aspect of the invention, for interconnecting electrical contacts or electrodes (230be) of semiconductor chips (230a, 230b, 230c) in an HDI context, includes the step of applying laser energy to make a pattern of apertures through a dielectric film which corresponds to the ideal locations of electrodes of semiconductor chips properly placed on the film. This may be accomplished, in one mode of the method, by procuring an optical mask (20) defining an ideal pattern of electrodes of semiconductor chips properly aligned in an HDI structure. This mask may be sufficiently large to cover a plurality of HDI circuits being made on a substrate, or it may cover only one such HDI circuit. Laser energy (30) is applied to a dielectric film (10; 10, 17) through apertures or transparent regions (22) of the mask, to thereby make the ideal pattern of holes in the film. Semiconductor chips (230a, 230b, 230c) are mounted to a first side (10ls, 17ls) of the dielectric film, as by means of adhesive, with the electrodes (230be) in registry with the corresponding ones of the holes (22). This has the effect of mounting the semiconductor chips (230a, 230b, 230c) in their ideal locations. Electrically conductive material (310), such as metallization, is applied to a second side (10us) of the film (10) and to at least the sides of the holes (42a, 42b), so as to interconnect the electrodes (230be) with an interconnect pattern (320) of the electrically conductive material (310).

4 Claims, 6 Drawing Sheets

US 6,284,564 B1

HDI CHIP ATTACHMENT METHOD FOR REDUCED PROCESSING

FIELD OF THE INVENTION

This invention relates to methods for fabrication of High Density Interconnect (HDI) circuits, and more particularly to such methods which reduce the number of processing steps.

BACKGROUND OF THE INVENTION

HDI circuits are formed by mounting two or more semiconductor chips so that those surfaces having electrodes are coplanar, and then applying a layer of visually transparent, ultraviolet absorbent dielectric material, generally polyimide, over the electrode or bonding pad sides of the juxtaposed semiconductor chips. A laser is optically aligned to the position of each chip through the transparent dielectric, and an ultraviolet laser beam is used to make holes through the dielectric material at the locations of the electrodes of the semiconductor chips.

Improved HDI manufacturing is desired.

SUMMARY OF THE INVENTION

After the holes are made in the dielectric material in a prior-art method for fabricating HDI structures, and the holes are converted into conductive vias by addition of metallization, a further step is required, which is the step of adding individualized interconnection traces between the set of through vias of each semiconductor chip, whatever orientation they may have, to the standardized interconnection pattern. This task is accomplished by providing an "adaptive" region on the dielectric material around each semiconductor chip, in which the individualized traces are added to connect the various through vias to the standardized interconnection pattern. According to an aspect of the invention, in order to reduce the number of laser alignments required to make the holes through the dielectric interconnection film and to thereby reduce the cost of manufacture, apertures are pre-formed in the dielectric film, using direct writing by a laser or a laser and a mask, at the locations which the electrodes to be interconnected would be if the semiconductor chip mountings were perfect. These holes can be made by illuminating the dielectric film through the apertures of a direct or projection mask which extends over the entirety of the HDI film surface. If the laser beam subtends the entire mask, then no more is needed than to make the apertures. If the laser beam does not subtend the mask, then it may be scanned or stepped over the surface of the mask, so as to form apertures in the underlying dielectric film at the locations of the transparent regions or holes in the mask. As an alternative to the use of a mask, direct laser writing may be used to make the apertures.

After the holes are made in the dielectric film, the semiconductor chips are mounted to a first side or obverse side of the film, with their various electrodes over the holes. This procedure may use "pick-and-place" robotics, while observing the obverse of the film, for placing the chips over the holes. This placement may be further aided by a further optical alignment apparatus, observing the reverse side of the film, for aligning the electrodes visible through the holes in the film, to perform the final alignment. The semiconductor chips may be held in place by any means, including a layer of uncured adhesive material applied to the obverse side of the film, and perforated together with the film material itself. At this point in the fabrication, the chips are perfectly aligned with the through vias, which are perfectly aligned with the mask representing perfect alignment. If the mounting of the semiconductor chips to the dielectric film was performed by using uncured adhesive, the adhesive may now be cured. The interconnection pattern can be applied to the through vias by way of a further mask which matches with the perfectly aligned vias, thereby eliminating the need for the adaptive region. The remaining steps of the HDI processing are conventional.

More particularly, a method according to an aspect of the invention, for interconnecting electrical contacts of semiconductor chips in an HDI context, includes the step applying laser energy to produce apertures or through holes in a dielectric film in a pattern corresponding to the ideal locations of electrodes or terminals of semiconductor chips properly placed on the dielectric film. In one embodiment, this step may include the step of procuring an optical mask defining an ideal pattern of electrodes of semiconductor chips properly aligned in an HDI structure. This mask may be sufficiently large to cover a plurality of HDI circuits being made on a substrate, or it may cover only one such HDI circuit. Laser energy is applied to a dielectric film through apertures or transparent regions of the mask, to thereby make the ideal pattern of holes in the film. Semiconductor chips are mounted to a first side of the dielectric film, with the electrodes in registry with the holes. This has the effect of mounting the semiconductor chips in their ideal locations. The mounting of the semiconductor chips may be accomplished by application of uncured adhesive to the first side of the film before the making of the apertures in the film. The adhesive is then cured, without allowing the holes to close. Electrically conductive material, such as metallization, is applied to a second side of the film and to at least the sides of the holes, so as to interconnect the electrodes with an interconnect pattern of the electrically conductive material.

DESCRIPTION OF THE INVENTION

Figure 1A:
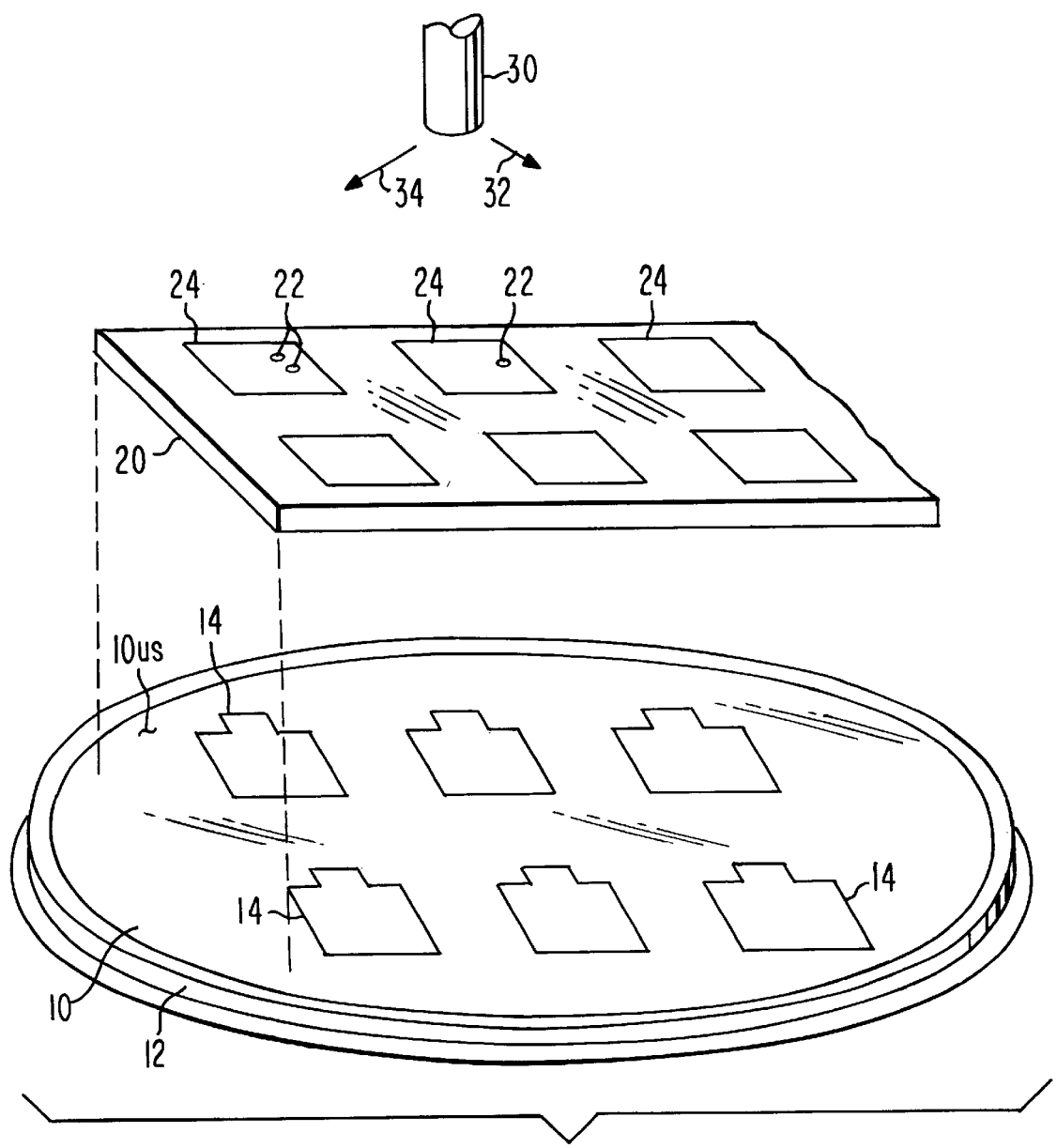
FIG. 1a is a simplified perspective or isometric view of a portion of the method according to an aspect of the invention.
Figure 1B:
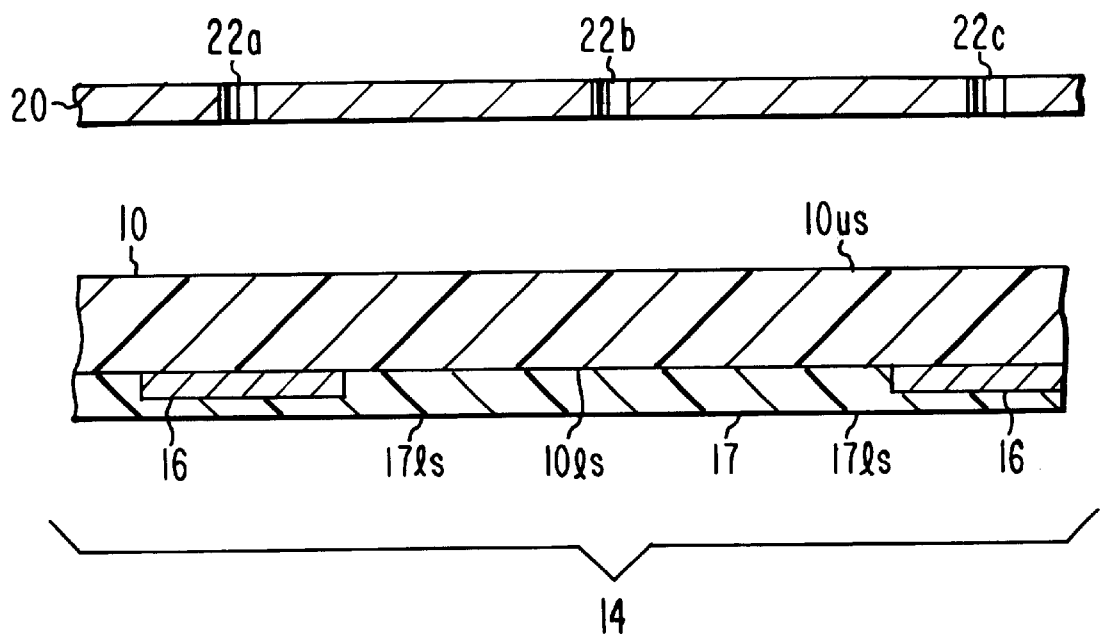
FIG. 1b is a cross-sectional or elevation view of FIG. 1a, and FIG. 1c is a similar cross-section illustrating the results of a step in the method.

In FIG. 1a, a dielectric sheet 10 is stretched by a spring hoop or spring ring arrangement 12, which holds the sheet 10 taut, with its broad surface 10us uppermost. The sheet 10 may be preprinted on its lower surface (not visible in FIG. 1a) with a pattern of electrical conductors 16 in various regions 14. These preprinted electrical conductors, in the case of microwave circuits, might be used as a ground plane. A mask 20 defines a plurality of apertures, some of which are designated 22, grouped into regions 24. The regions 24 of the mask are registered with regions 24 on the dielectric film 10. Within each region 24 of the mask 20, each aperture 22 is registered with a region in which an interconnection is to be made between layers of dielectric (if multiple layers are present). In the case in which a single layer of dielectric is used, such as layer 10, the apertures in the mask 20 are selected to overlie those regions in which an electrode of a chip is to make connection to a conductive pattern, which is later to be applied on the upper side of film 10. Apertures, such as apertures 22a of FIG. 1b, may be located at regions overlying the metallization regions 16, so as to "dither," drill or form apertures through which contact can be made between metallization layers, as for example for the making of ground connections. Apertures 22b of FIG. 1b in mask 20 may be made at locations at which holes are desired for making connections to the electrodes of chips to be added in a later step. FIG. 1b also illustrates a layer 17 of adhesive applied to the lower side 10ls of dielectric sheet 10 and its metallizations 16.

It should be appreciated that each region 14 corresponds to that region which, after completion of the processing, is associated with a complete HDI circuit. Thus, the surface of film 10 as illustrated in FIG. 1a bears the makings for six HDI circuits. Of course, these circuits will be cut apart or separated after batch fabrication. As illustrated in FIG. 1a, the preferred dimension of mask 20 is such as to make all the apertures for all of the HDI circuits in one step. However, it is sufficient for purposes of the invention that the mask 20 cover or extend over a complete HDI circuit region 14, so that the apertures formed therein are properly or ideally registered.

Figure 1C:
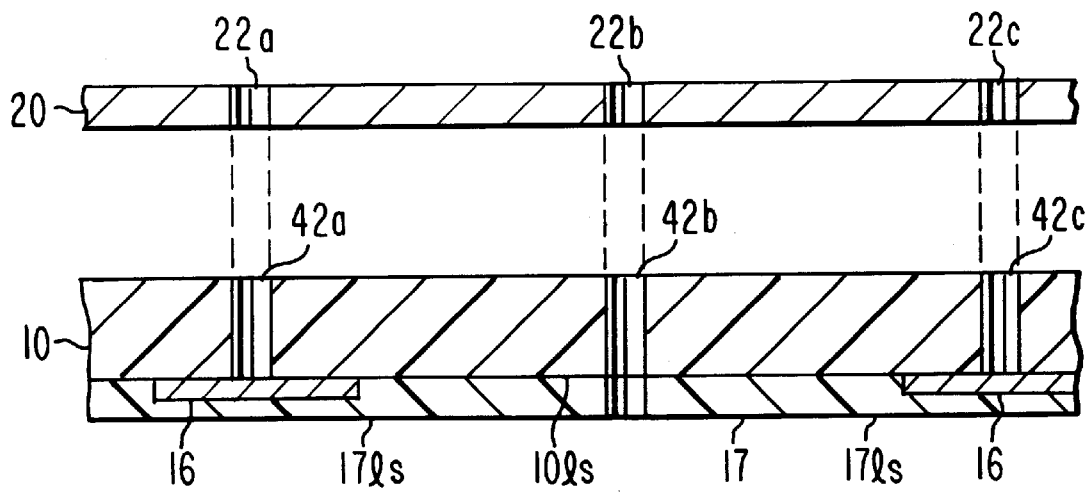

In FIG. 1a, a laser beam illustrated as 30 from a source (not illustrated) is scanned or stepped in two mutually orthogonal dimensions across the mask 20, as suggested by arrows 32 and 34. Naturally, if the laser beam is wide enough to subtend the entirety of the pattern of mask 20, scanning or stepping is not required. Where the mask 20 contains apertures or transparent regions, light of the laser beam 30 passes therethrough, to illuminate the underlying film 10. FIG. 1c illustrates a cross-section of a portion of the structure of FIG. 1a corresponding to that of FIG. 1b, illustrating the holes 42a made in the dielectric film 10 by the laser beam passing through apertures 22a overlying portions of the metallization 16, and the holes 42b made through the dielectric sheet 10 and the underlying adhesive layer 17 by the laser light passing through apertures 22b at locations which do not overlie metallization(s) 16. In FIG. 1c, the apertures corresponding to those made by laser light passing through apertures 22a are designated 42a, and those made by light passing through apertures 22b are designated 42b. The holes formed by light passing through apertures 22b extend from the upper surface 10us of dielectric film 10 to the lower surface 17ls of adhesive layer 17.

In order for the light beam 30 of FIG. 1a to make apertures 42a and 42b of FIG. 1c, the dielectric film 10, and the adhesive layer 17, if used, must be absorbent at the wavelength of the laser beam, so that ablation can take place. For the case in which the dielectric film 10 is polyimide, absorption takes place in the ultraviolet range, and particularly at 248 nanometers. The laser energy passing through the holes ablates the dielectric film, and any adhesive applied to a back side of the film, to make a pattern of holes in registry or alignment with the pattern of holes or apertures 22 in the mask 20.

Figure 2:
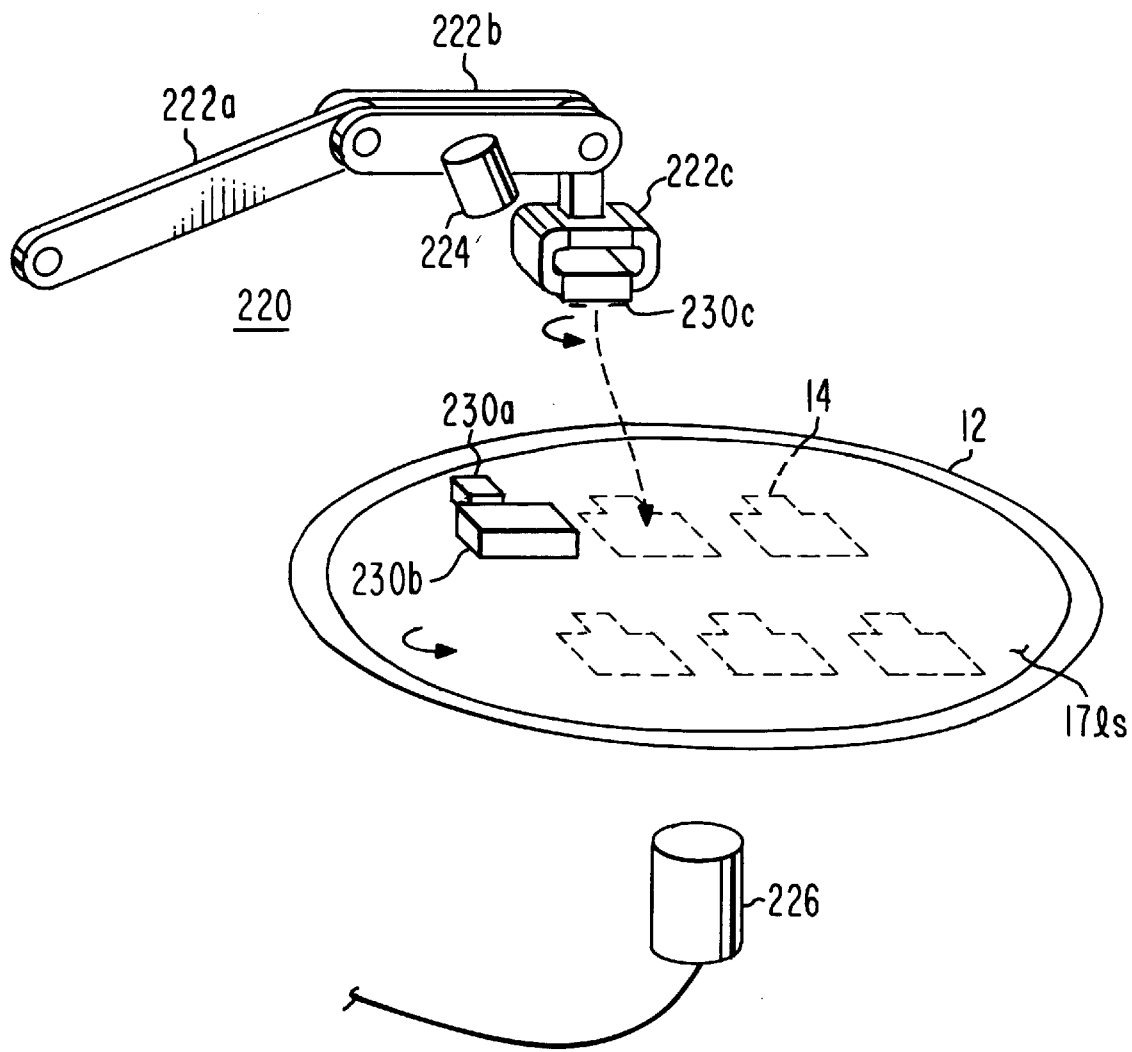
FIG. 2 is a simplified perspective or isometric illustration of a pick-and-place step in accordance with an aspect of the method of the invention.

FIG. 2 is a simplified diagram of a further step in the method of the invention.

If the dielectric sheet of FIG. 1a had no prior metallization, the only constraint on the side onto which the semiconductor chips are placed is that established by the pattern of holes in the dielectric sheet. If, on the other hand, a metallization pattern, such as pattern 16 of FIGS. 1b and 1c had already been established before the making of the holes, the dielectric sheet 10 must be turned over, so that the visible side is side 10ls, or 17ls if adhesive is used. In the step of the method illustrated in FIG. 2, a pick-and-place machine, designated generally as 220, has an articulated member including arms 222a and 222b supporting a chip holder 222c, and is associated with an electronic vision arrangement including cameras 224 and 226. Machine 220 picks up the semiconductor chips, such as chip 230c of FIG. 2, and orients them to the predrilled apertures 42b (and 42a if appropriate), and sets them down on the adhesive layer, with the electrodes, terminal pads, or bonding pads to which connections are made registered with the corresponding apertures. For this purpose, the pick-and-place machine is associated with two separate, but interacting, vision systems 224 and 226. Vision system 224 views the upper surface 17ls of the film to determine the locations and orientations of the hole patterns, and vision system 226 observes, from below, the underside (the electrical connection side) of the chip 230c held by the holding arm 222c, to determine the rotational position of its electrode pattern. Such a machine is commercially available as model 505, fabricated by Micro Robotics Systems Inc., of 25 Industrial Ave., Chelmsford, Mass. 01824. The pick-and-place machine places each of the chips on the appropriate portion of the aperture pattern, as suggested in FIG. 2, where two chips, namely chips 230a and 230b, have been placed on one of the many regions 14. A third chip, designated 230c, is held by the holder 222c of machine 220 in FIG. 2, and is about to be placed on a second one of the regions 14. Thus, each region 14 as illustrated in FIG. 2, corresponding to one HDI circuit, is associated with two chips. Since the adhesive side of the film is upward, the chips will be held in place by the tacky adhesive until such later time at which the adhesive is cured.

Since the apertures 42a, 42b of FIG. 1c with which the placed chips are registered in the step illustrated in FIG. 2 are themselves made from a mask which accurately places all of the apertures for at least one region 14, all of the chips placed on a particular region 14 will be accurately placed relative to all other chips placed in the same region. Of course, it is preferable that the mask 20 be dimensioned to simultaneously form all of the apertures 42a, 42b in all of the regions 14 on a particular film 10. If the existing metallizations, such as metallizations 16 of FIG. 1b, were also placed by use of a mask registered with the aperture-producing mask, the chips will also be accurately placed relative to such existing metallization.

Following the step illustrated in conjunction with FIG. 2, the adhesive 17 is cured by baking, so as to prevent further motion of the chips relative to the film 10.

Either of two steps can be performed next, in either order. These steps are (a) the encapsulation of the chips in an encapsulant, which may be, for example, filled epoxy resin, and (b) the formation of the chip-connecting electrically conductive interconnections on side 10us of the film.

Figure 3A:
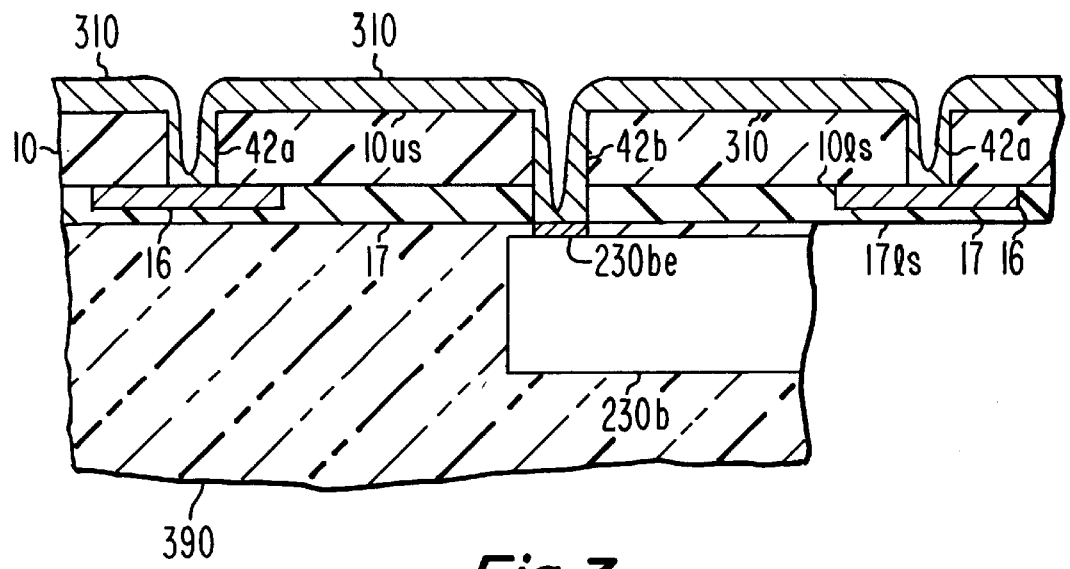
FIGS. 3a, 3b, 3c, 3d, and 3e illustrate the result of further steps in the method according to an aspect of the invention.
Figure 3B:
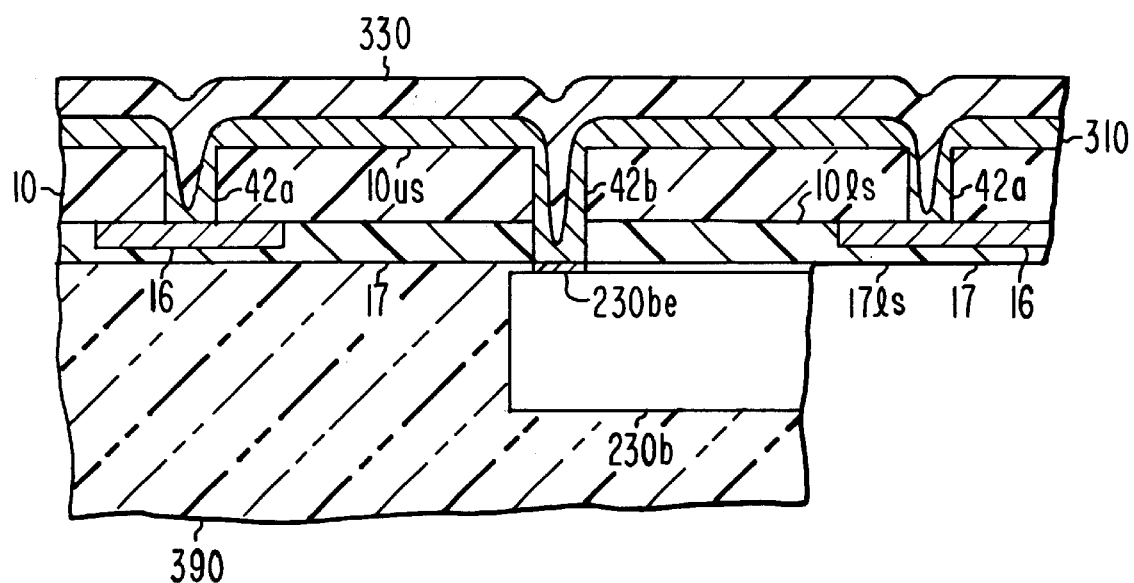
Figure 3C:
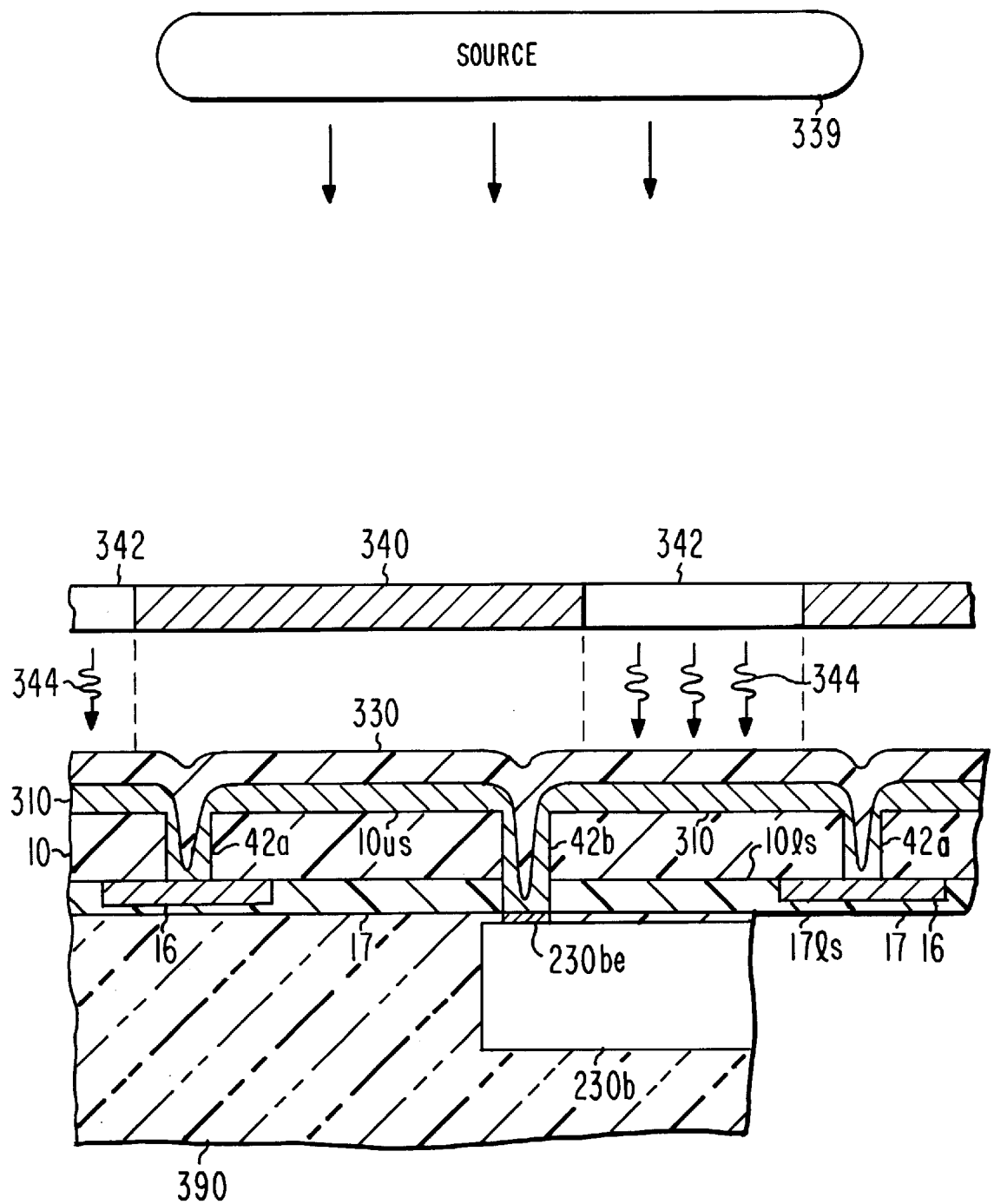
Figure 3D:
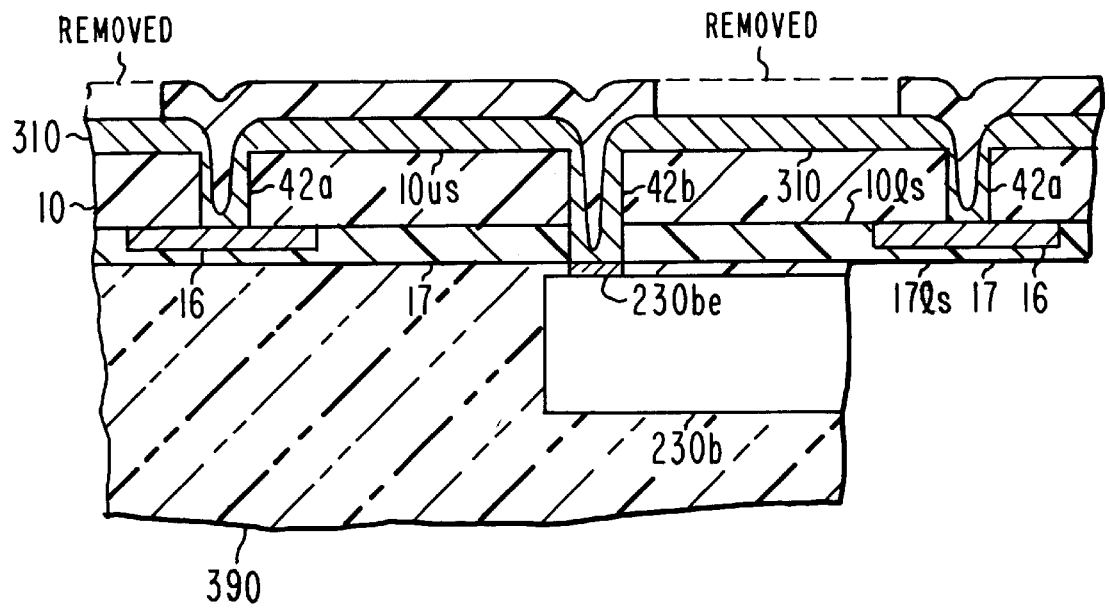
Figure 3E:
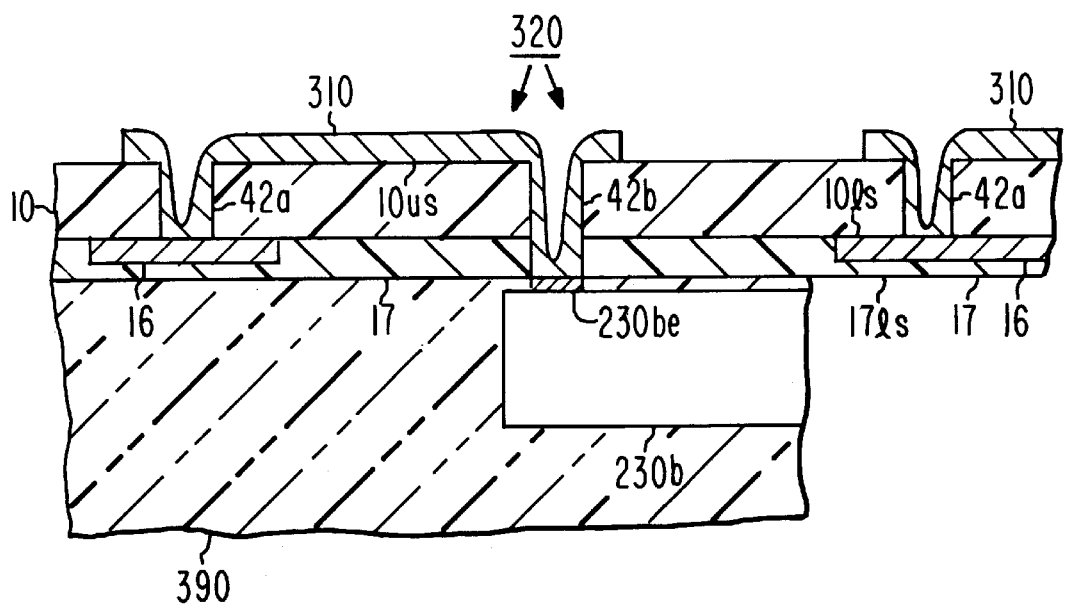

The step (a) listed above of making the electrically conductive interconnects is illustrated with the aid of FIGS. 3a and 3b. In FIG. 3a, a layer 310 of metallization is applied over the entirety of the relevant portion of the upper surface 10us of the dielectric film 10. This layer 310 of metallization extends into the preformed holes 42a and 42b, making connection of the metallization layer 310 to the lower metallization layer or layers 16, and also to the electrodes, such as electrode 230be, of the previously placed chips, as for example chip 230b. Following the step illustrated in FIG. 3a, the metallization is coated with a layer 330 of resist, as illustrated in FIG. 3b. The layer 330 of resist is exposed to a source 339 of light through a further mask 340 registered with the aperture pattern or with registration markings placed on the film, as illustrated in FIG. 3c. Mask 340 includes transparent portions or apertures 342, through which light, illustrated by photon symbols 344, can pass to expose the layer 330 of resist. The layers of resist so exposed become susceptible to removal by a solvent, but the appearance of the structure after being exposed is identical to that of FIG. 3b. Following the step illustrated in FIG. 3d, the exposed portions of the layer 330 of resist are washed away or removed, as illustrated in FIG. 3d, leaving the resist 330 in the areas in which metallization is to remain. The metallization layer 310 of FIG. 3d and its patterned resist 330 are exposed to an etchant, and the exposed portions of the metallization are etched away, leaving resist-coated metallization 330 in a pattern 320, as suggested by FIG. 3e. The pattern 320, as described, is established by a mask which extends over at least one complete HDI circuit, just as the mask 20 of FIG. 1a extends over at least one complete HDI circuit region 14. As described, the steps in the formation of the electrically conductive pattern on the upper surface 10us of the film 10 results in connection between the left-most aperture 42a and the aperture 42b, but not between aperture 42b and the right-most aperture 42a. The steps associated with FIGS. 3a through 3e are conventional, and require no further explanation.

Other conventional techniques for forming an electrically conductive pattern on surface 10us may be used instead of the steps described in conjunction with FIGS. 3a and 3b.

The step (step b listed above) of encapsulation of the chips is performed in conventional manner, such as that described in a copending patent application Ser. No. 09/340,240 Gorczyca et al., filed Jul. 1, 1999 and entitled, *METHOD FOR MAKING AIR POCKETS IN AN HDI CONTEXT*, and requires no further explanation. In short, this method places a removable retaining wall around the chips 230a, 230b, . . . on the side of the film-plus-adhesive illustrated in FIG. 2, followed by pouring molding material into the region within the wall. The molding material is cured, and the retaining wall is removed. FIG. 3a, 3b, 3c, 3d, 3e, and 3f illustrate, in phantom, the cured molding material 390 applied over adhesive layer 17 in the region surrounding chip 230b.

Other embodiments of the invention will be apparent to those skilled in the art. For example, while the metallization conductors on the dielectric film have been described as being on one side of the film, those skilled in the art know that both sides can have such conductive depositions or traces. While only two chips have been described as being associated with each HDI circuit, and six HDI circuits with one batch fabrication, those skilled in the art know that many more chips can be associated with each HDI circuit, and that the number of HDI circuits which can be processed in one batch may be larger or smaller than six, depending upon the quantity required, the relative sizes of the HDI circuit regions and the batch fabrication dimensional capacity, and many other factors.

Thus, a method according to an aspect of the invention, for interconnecting electrical contacts or electrodes (230be) of semiconductor chips (230a, 230b, 230c) in an HDI context, includes the step of producing in a dielectric film a pattern of holes corresponding to the ideal locations of the electrodes of semiconductor chips properly aligned on the HDI circuit. This may be performed by direct laser writing, or by procuring an optical mask (20) defining an ideal pattern of electrodes of semiconductor chips properly aligned in an HDI structure. This mask may be sufficiently large to cover a plurality of HDI circuits being made on a substrate, or it may cover only one such HDI circuit. Laser energy (30) is applied to a dielectric film (10; 10, 17) either directly, or through apertures or transparent regions (22) of the mask, to thereby make the ideal pattern of holes in the film. Semiconductor chips (230a, 230b, 230c) are mounted to a first side (10ls, 17ls) of the dielectric film, with the electrodes (230be) in registry with the corresponding ones of the holes (22). This has the effect of mounting the semiconductor chips (230a, 230b, 230c) in their ideal locations over the entirety of the HDI circuit. The mounting step may be performed by applying uncured adhesive to a first side of the dielectric film before the step of making holes in the film, so that the holes extend through the adhesive. Following the application of the semiconductor chips to the adhesive, the adhesive is cured without closing the apertures. Electrically conductive material (310), such as metallization, is applied to a second side (10us) of the film (10) and to at least the sides of the holes (42a, 42b), so as to interconnect the electrodes (230be) with an interconnect pattern (320) of the electrically conductive material (310). When the film is coated with cured adhesive, the step of applying electrically conductive material includes the application of the material over the sides of the holes in the cured adhesive.

What is claimed is:

1. A method for interconnecting electrical contacts of semiconductor chips in an HDI context, said method comprising the steps of:

applying laser energy to a dielectric film, to thereby make a pattern of holes in said film, said pattern corresponding in location to the locations of electrodes of semiconductor chips properly aligned in an HDI structure;

mounting semiconductor chips to a first side of said dielectric film, with said electrodes in registry with said holes, whereby said chips assume said proper alignment; and applying electrically conductive material to a second side of said film and to at least the sides of said holes, so as to interconnect said electrodes with an interconnect pattern of said electrically conductive material.

2. A method according to claim 1, wherein said step of applying laser energy includes the steps of:

procuring an optical mask defining an ideal pattern of electrodes of semiconductor chips properly aligned in an HDI structure; and applying said laser energy to said dielectric film through one of apertures and transparent regions of said mask.

3. A method for interconnecting electrical contacts of semiconductor chips in an HDI context, said method comprising the steps of:

applying laser energy to a dielectric film, to thereby make a pattern of holes in said film, said pattern corresponding in location to the locations of electrodes of semiconductor chips properly aligned in an HDI structure;

mounting semiconductor chips to a first side of said dielectric film, with said electrodes in registry with said holes, whereby said chips assume said proper alignment; and applying electrically conductive material to a second side of said film and to at least the sides of said holes, so as to interconnect said electrodes with an interconnect pattern of said electrically conductive material;

wherein said step of mounting semiconductor chips to a first side of said dielectric film includes the steps of (a) applying uncured adhesive to said first side of said dielectric film before said step of applying laser energy, (b) mounting said semiconductor chips to said uncured adhesive; and (c) curing said adhesive.

4. A method for interconnecting electrical contacts of semiconductor chips in an HDI context, said method comprising the steps of:

procuring an optical mask defining an ideal pattern of electrodes of semiconductor chips properly aligned in an HDI structure;

applying laser energy through said mask to a dielectric film, to thereby make said ideal pattern of holes in said film;

mounting semiconductor chips to a first side of said dielectric film, with said electrodes in registry with said holes;

applying electrically conductive material to a second side of said film and to at least the sides of said holes, so as to interconnect said electrodes with an interconnect pattern of said electrically conductive material.

* * * * *